(12) United States Patent
Kuraguchi

(10) Patent No.: US 9,105,565 B2
(45) Date of Patent: Aug. 11, 2015

(54) NITRIDE SEMICONDUCTOR DEVICE

(71) Applicant: Kabushiki Kaisha Toshiba, Tokyo (JP)

(72) Inventor: Masahiko Kuraguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 194 days.

(21) Appl. No.: 13/792,426

(22) Filed: Mar. 11, 2013

(65) Prior Publication Data

US 2013/0248874 A1    Sep. 26, 2013

(30) Foreign Application Priority Data

Mar. 26, 2012 (JP) ................. 2012-069988

(51) Int. Cl.
| | | |
|---|---|---|
| H01L 29/778 | (2006.01) | |
| H01L 29/20 | (2006.01) | |
| H01L 29/417 | (2006.01) | |
| H01L 29/45 | (2006.01) | |
| H01L 29/423 | (2006.01) | |

(52) U.S. Cl.
CPC ...... *H01L 29/2003* (2013.01); *H01L 29/41766* (2013.01); *H01L 29/452* (2013.01); *H01L 29/778* (2013.01); *H01L 29/7789* (2013.01); *H01L 29/4236* (2013.01)

(58) Field of Classification Search
CPC ... H01L 29/20; H01L 29/2003; H01L 29/778; H01L 29/7786
See application file for complete search history.

(56) References Cited

U.S. PATENT DOCUMENTS

| | | | | |
|---|---|---|---|---|
| 7,998,848 | B2 * | 8/2011 | Niiyama et al. | 438/522 |
| 2009/0072272 | A1 | 3/2009 | Suh et al. | |
| 2012/0292665 | A1 * | 11/2012 | Marino et al. | 257/194 |
| 2013/0248873 | A1 * | 9/2013 | Kuraguchi et al. | 257/76 |

FOREIGN PATENT DOCUMENTS

| | | |
|---|---|---|
| JP | 2001-168111 | 6/2001 |
| JP | 2007-134608 A | 5/2007 |
| JP | 2008-135575 | 6/2008 |
| JP | 2010-135824 | 6/2010 |
| JP | 2011-181934 A | 9/2011 |
| JP | 2011-233612 A | 11/2011 |

OTHER PUBLICATIONS

Japanese Office Action issued May 15, 2014 in Patent Application No. 2012-069988 with English Translation.

* cited by examiner

*Primary Examiner* — Evan Pert
(74) *Attorney, Agent, or Firm* — Oblon, McClelland, Maier & Neustadt, L.L.P.

(57) ABSTRACT

According to one embodiment, a nitride semiconductor device includes semiconductor stacked layers provided on a substrate and including a nitride semiconductor; a source electrode and a drain electrode provided on the layers and being in contact with the layers; and a gate electrode provided on the layers and provided between the source electrode and the drain electrode. The layers have a first barrier layer, a second barrier layer, and a carrier running layer interposed between the first barrier layer and the second barrier layer. The second barrier layer and the carrier running layer are removed in a region in which the source electrode on the layers is provided. A part of the source electrode is in contact with the first barrier layer. And another part of the source electrode other than the part of the source electrode is in contact with the second barrier layer.

17 Claims, 3 Drawing Sheets

NITRIDE SEMICONDUCTOR DEVICE

CROSS-REFERENCE TO RELATED APPLICATIONS

This application is based upon and claims the benefit of priority from the prior Japanese Patent Application No.2012-069988, filed on Mar. 26, 2012; the entire contents of which are incorporated herein by reference.

FIELD

Embodiments described herein relate generally to a nitride semiconductor device.

BACKGROUND

In a semiconductor device, it is effective to use a material having a high critical electric field in order to realize a high breakdown voltage and a low on resistance. Since a nitride semiconductor has a high intensity of the critical electric field, the semiconductor device realizing the high breakdown voltage and the low on resistance is achieved by using the nitride semiconductor.

In the nitride semiconductor device, as a method of increasing an avalanche capability, a method of connecting a source electrode to a substrate, or alternatively a method using a p-type GaN layer or using a layer structure in which a two-dimensional hole gas is generated is employed.

DETAILED DESCRIPTION

In general, according to one embodiment, a nitride semiconductor device includes substrate; semiconductor stacked layers provided on the substrate and including a nitride semiconductor; a source electrode and a drain electrode provided on the semiconductor stacked layers and being in contact with the semiconductor stacked layers; and a gate electrode provided on the semiconductor stacked layers and provided between the source electrode and the drain electrode.

The semiconductor stacked layers have a first barrier layer, a second barrier layer, and a carrier running layer interposed between the first barrier layer and the second barrier layer. The second barrier layer and the carrier running layer are removed in a region in which the source electrode on the semiconductor stacked layers is provided. A part of the source electrode is in contact with the first barrier layer. And another part of the source electrode other than the part of the source electrode is in contact with the second barrier layer.

Hereinafter, embodiments will be described with reference to drawings. In the following description of the drawings, the same or similar portions are denoted with the same or similar symbols.

(First Embodiment)

Figure 1A:
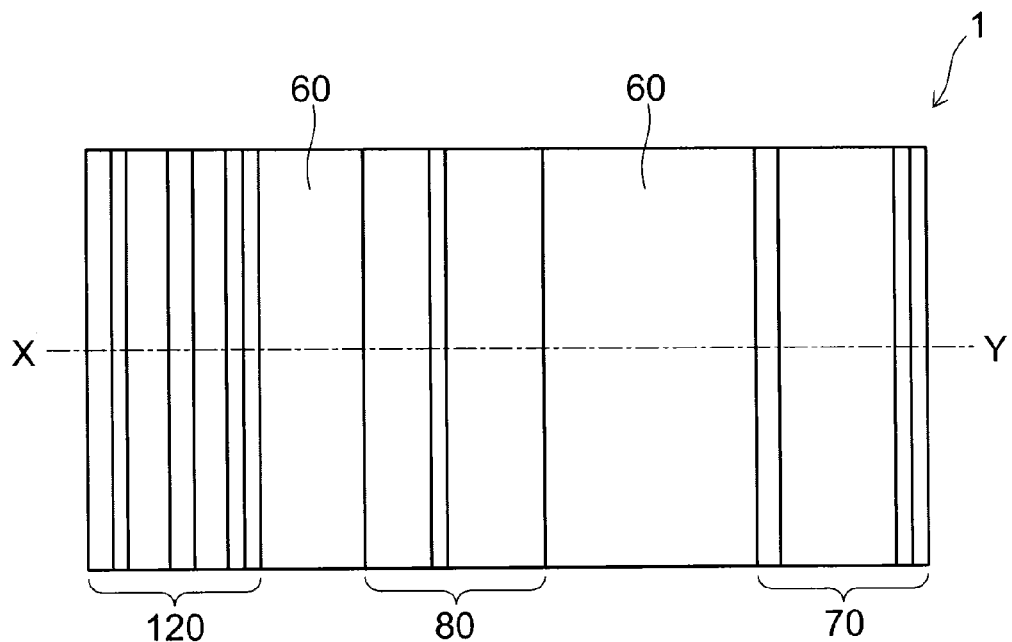
FIGS. 1A and 1B are schematic views illustrating a nitride semiconductor device according to a first embodiment.
Figure 1B:
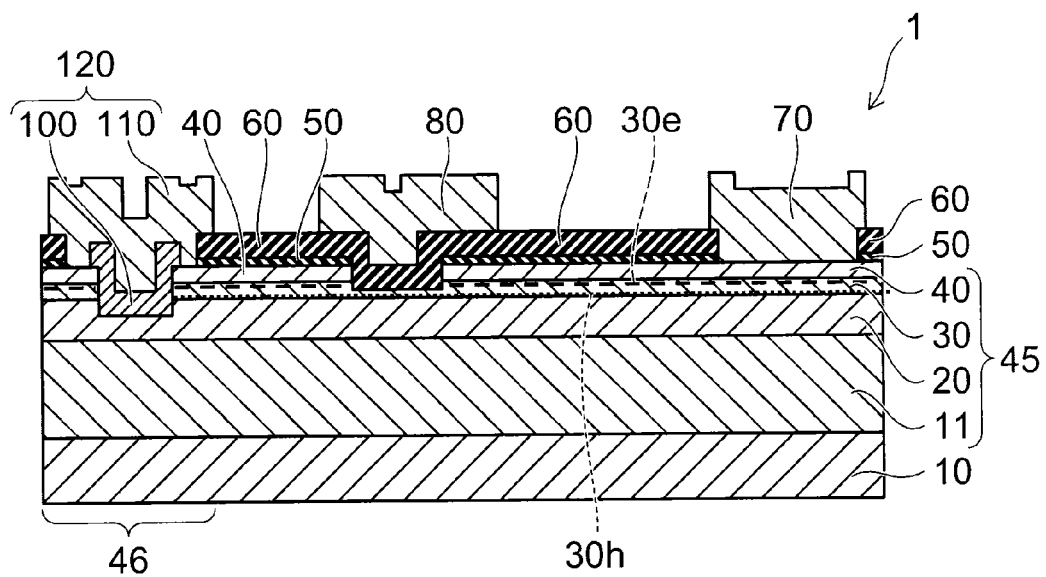

FIGS. 1A and 1B are schematic views illustrating a nitride semiconductor device according to a first embodiment, in which FIG. 1A is a schematic plan view, and FIG. 1B is a schematic cross-sectional view in an X-Y position of FIG. 1A.

The nitride semiconductor device 1 according to the first embodiment shown in FIGS. 1A and 1B includes a foundation layer (also referred to as a substrate, e.g., Si substrate 10), a semiconductor stacked body (also referred to as semiconductor stacked layers) 45 provided on the foundation layer and including a nitride semiconductor, a source electrode 120 and a drain electrode 70 provided on the semiconductor stacked body 45, and a gate electrode 80 provided on the semiconductor stacked body 45 and provided between the source electrode 120 and the drain electrode 70.

The semiconductor stacked body 45 has a first barrier layer 20, a second barrier layer 40, and a carrier running layer 30 interposed between the first barrier layer 20 and the second barrier layer 40.

In a region 46 in which the source electrode 120 on the semiconductor stacked body 45 is provided, the second barrier layer 40 and the carrier running layer 30 are removed. A part of the source electrode 120 is in contact with the first barrier layer 20. Another part of the source electrode 120 other than the part of the source electrode 120 is in contact with the second barrier layer 40.

The source electrode 120, the drain electrode 70, and the gate electrode 80 have a stripe shape when viewed in a direction perpendicular to a main surface of the Si substrate 10.

In the nitride semiconductor device 1, a buffer layer 11 is provided on the Si substrate 10. Since the buffer layer 11 is provided, a mismatch strain caused by a difference between a lattice constant of the Si substrate 10 and a lattice constant of the nitride semiconductor layer on the buffer layer 11 is relaxed.

In addition, the buffer layer 11 is required to have a breakdown voltage not less than a potential difference between the Si substrate 10 and the electrode in addition to a function of relaxing the lattice constant difference. In the buffer layer 11, a film thickness in proportion to the breakdown voltage of the nitride semiconductor device 1 is necessary. For example, when the nitride semiconductor device 1 has a breakdown voltage of 600 V, it is necessary for the buffer layer 11 to have the appropriate film thickness of 5 μm. The buffer layer 11 includes a superlattice of GaN/AlGaN on AlN.

The first barrier layer 20 including the $Al_xGa_{1-x}N$ layer is provided on the buffer layer 11. The carrier running layer 30 including a GaN layer is provided on the first barrier layer 20. The carrier running layer 30 is a non-doped layer. The second barrier layer 40 including an $Al_yGa_{1-y}N$ layer (Y>X) is provided on the carrier running layer 30.

A film thickness of the first barrier layer 20 is, for example, 20 nm or more and 2 μm or less. When the film thickness of the first barrier layer 20 is smaller than the film thickness described above, electrons generated within the carrier running layer 30 may leak into the buffer layer 11. For this reason, it is desired that the first barrier layer 20 have the film thickness described above. A film thickness of the carrier running layer 30 is, for example, 50 nm. A film thickness of the second barrier layer 40 is 5 nm or more and 40 nm or less.

A two-dimensional electron system $30e$ is formed near an interface between the carrier running layer 30 and the second barrier layer 40 within the carrier running layer 30 by polarization caused the mismatch strain by the lattice constant difference between the GaN layer (carrier running layer 30) and the $Al_XGa_{1-X}N$ layer (second barrier layer 40). That is, a channel of a transistor can be formed by the nitride semiconductor device 1. In addition, a two-dimensional hole system 30h is formed near an interface between the carrier running layer 30 and the first barrier layer 20 within the carrier running layer 30. In the specification, electrons generated in the two-dimensional electron system 30e may be referred to as a two-dimensional electron gas (2DEG), and holes generated in the two-dimensional hole system 30h may be referred to as a two-dimensional hole gas (2DHG).

A surface protection film (also referred to as a surface passivation film) 50 including a SiN film is provided on the second barrier layer 40. A gate insulating film 60 including at least one selected from the group consisting of a SiN film, a $SiO_2$ film, an $Al_2O_3$ film, and various high-k (high dielectric) films is provided on the surface protection film 50.

In the nitride semiconductor device 1, a part of the surface protection film 50 and a gate insulating film 60 on the part of the surface protection film 50 are removed. The drain electrode 70 is provided in the removed position. The drain electrode 70 is in contact with the second barrier layer 40. The drain electrode 70 is electrically in ohmic contact with the two-dimensional electron system 30e.

In the nitride semiconductor device 1, a part of the surface protection film 50 in a region separate from the region in which the drain electrode 70 is removed, and a part of the carrier running layer 30 and the second barrier layer 40 below the part of the surface protection film 50 are removed. The gate insulating film 60 is provided in the removed portion. That is, the gate insulating film 60 is formed to protrude toward the carrier running layer 30 from the interface position between the carrier running layer 30 and the second barrier layer 40. The gate electrode 80 is provided on the gate insulating film 60.

In the nitride semiconductor device 1, in addition to the drain electrode 70 and the gate electrode 80, the source electrode 120 is provided. The second barrier layer 40, the carrier running layer 30, and a part of the surface of the first barrier layer 20 are removed in the position in which the source electrode 120 is provided. The source electrode 120 includes a first source electrode 100 and a second source electrode 110. At least a part of the first source electrode 100 is in contact with the first barrier layer 20, and at least a part of the second source electrode 110 is in contact with the second barrier layer 40. The first source electrode 100 is an electrode to p-type semiconductor, and the second source electrode 110 is an electrode to n-type semiconductor.

The source electrode 120 is in ohmic contact with the two-dimensional electron system 30e at the portion of the source electrode in contact with the second barrier layer 40. The source electrode 120 is in ohmic contact with the two-dimensional hole system 30h by virtue of the portion of the source electrode in contact with the first barrier layer 20.

Figure 2:
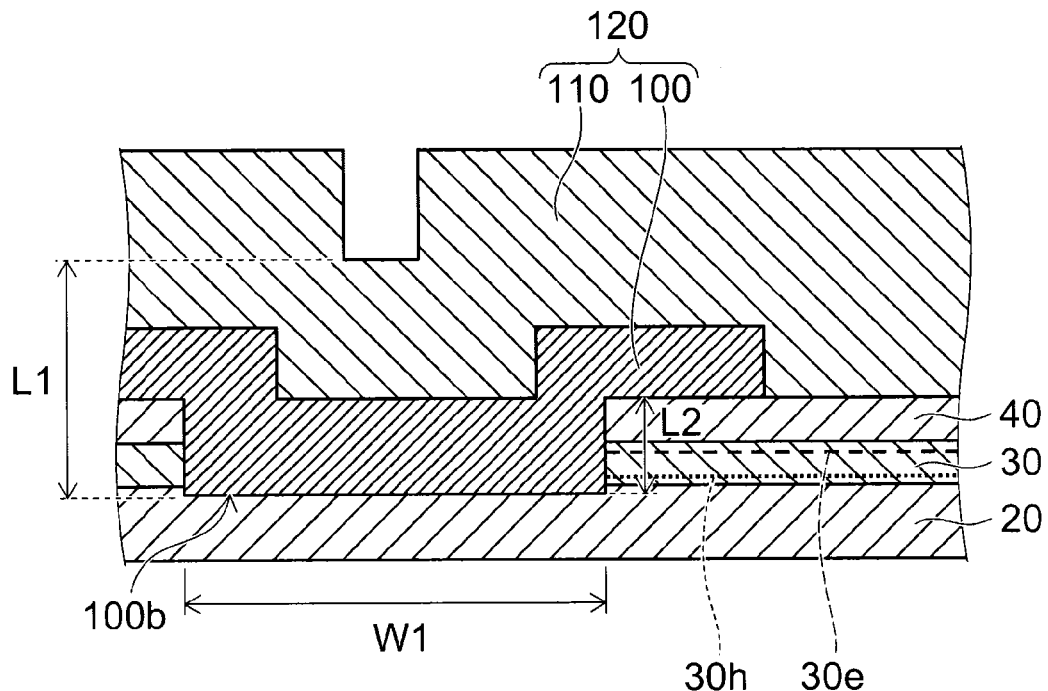
FIG. 2 is an enlarged cross-sectional view illustrating a source electrode on the gate electrode side of the nitride semiconductor device according to the first embodiment.

FIG. 2 is an enlarged cross-sectional view illustrating a source electrode on the gate electrode side of the nitride semiconductor device according to the first embodiment.

In the nitride semiconductor device 1, by removing the second barrier layer 40 and the carrier running layer 30 and burying the first source electrode 100, the first source electrode 100 and the two-dimensional hole system 30h are in ohmic contact with each other. In addition, the second source electrode 110 is in ohmic contact with the two-dimensional electron system 30e through the second barrier layer 40. L1, L2, and W1 of FIG. 2 will be described later.

Figure 3:
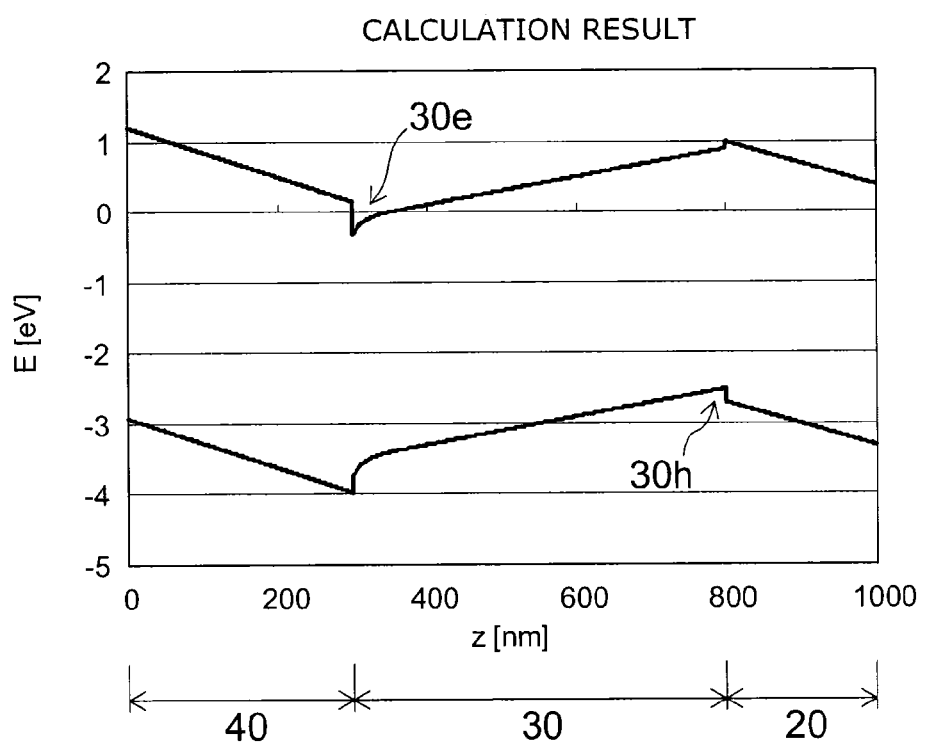
FIG. 3 is a graph describing a band structure of the nitride semiconductor device according to the first embodiment.

FIG. 3 is a graph describing a band structure of the nitride semiconductor device according to the first embodiment.

FIG. 3 is a band structure of the nitride semiconductor device 1 in a vertical direction by virtue of calculation. That is, a horizontal axis of FIG. 3 shows the depth from the second barrier layer 40 toward the first barrier layer 20, and a vertical axis thereof shows the energy. The range of each of the second barrier layer 40, the carrier running layer 30, and the first barrier layer 20 in a direction parallel to the horizontal axis of FIG. 2 is shown.

As shown in FIG. 3, the two-dimensional electron system 30e is formed near the interface between the carrier running layer 30 and the second barrier layer 40 within the carrier running layer 30 by polarization caused the mismatch strain by the lattice constant difference between the GaN layer and the $Al_YGa_{1-Y}N$ layer. In addition, a position having the lowest energy of the positive holes (holes) occurs near the interface between the carrier running layer 30 and the first barrier layer 20 within the carrier running layer 30 by the polarization of the first barrier layer 20 and the carrier running layer 30. Accordingly, when the holes are generated, the two-dimensional hole system 30h is formed near the interface between the carrier running layer 30 and the first barrier layer 20 within the carrier running layer 30.

As described above, in the nitride semiconductor device 1, it is possible to generate the two-dimensional electron system 30e and the two-dimensional hole system 30h within the non-doped carrier running layer 30 at the same time. Accordingly, in the nitride semiconductor device 1, when the avalanche breakdown occurs just before the breakdown voltage limit by applying a high voltage between the source and drain electrodes, the electrons are injected into the two-dimensional electron system 30e, and the holes are injected into the two-dimensional hole system 30h.

The electrons are moved toward the drain electrode 70 of which the potential is higher, and are absorbed by the drain electrode 70 in ohmic contact with the two-dimensional electron system 30e. In addition, the holes are moved toward the source electrode 120 of which the potential is lower, and are absorbed by the source electrode 120 in ohmic contact with the two-dimensional hole system 30h. Accordingly, since the electrons and the holes generated by the avalanche breakdown within the carrier running layer 30 are absorbed by the two-dimensional electron system 30e and the two-dimensional hole system 30h within the same layer, the carriers can be effectively discharged from the carrier running layer 30.

In addition, in the nitride semiconductor device 1 in which the two-dimensional electron system 30e and the two-dimensional hole system 30h can be generated within the non-doped carrier running layer 30 at the same time, the mobility of the two-dimensional electron system 30e and the mobility of the two-dimensional hole system 30h become high. Therefore, it is possible to effectively absorb the electrons and the holes generated by the avalanche breakdown in the nitride semiconductor device 1. As a result, the nitride semiconductor device having the high avalanche capability can be realized.

In addition, in the nitride semiconductor device 1, it is notable that a material of the first source electrode 100 in contact with the first barrier layer 20 and in ohmic contact with the two-dimensional hole system 30h be made to be different from a material of the second source electrode 110 in contact with the second barrier layer 40 and in ohmic contact with the two-dimensional electron system 30e. That is, the kind of material of the first source electrode 100 is different from the kind of material of the second source electrode 110.

For example, a material including any of Ni, Pt, and Pd is used for the first source electrode 100. This enables the contact resistance between the first source electrode 100 and the two-dimensional hole system 30*h* to be decreased. A material including any of Ti and Al is used for the second source electrode 110. This enables the contact resistance between the second source electrode 110 and the two-dimensional electron system 30*e* to be decreased. As a result, it is possible to realize the low on resistance using the two-dimensional electron system 30*e* when the nitride semiconductor device 1 is an on state and to more effectively draw out holes from the source electrode 120 using the two-dimensional hole system 30*h* when the avalanche breakdown occurs.

In addition, the second source electrode 110 may be formed of the same material as the drain electrode 70. It is possible to readily fabricate the second source electrode 110 and the drain electrode 70 by using the same material.

In the nitride semiconductor device 1, the two-dimensional hole system 30*h* may be generated only when the avalanche breakdown occurs. Accordingly, it is notable that the energy of the valence band be lower than the Fermi energy showing zero energy in the interface between the first barrier layer 20 and the carrier running layer 30 as shown in FIG. 3. In addition, in order to decrease the on-resistance, it is notable that the carrier concentration of the two-dimensional electron system 30*e* be high. Accordingly, it is notable that the polarization generated on the side of the second barrier layer 40 be higher than the polarization generated on the side of the first barrier layer 20 within the carrier running layer 30.

Accordingly, when the nitride semiconductor device is configured by GaN and AlGaN, it is notable that $Al_XGa_{1-X}N$ is used for the first barrier layer 20, GaN is used for the carrier running layer 30, and the $Al_YGa_{1-Y}N$ layer (Y>X) is used for the second barrier layer 40. For example, the AlGaN layer having the Al composition ratio of which X is 0.1 or less is used for the first barrier layer 20, and the AlGaN layer of which Y is 0.2 or more is used for the second barrier layer 40. In addition, since the nitride semiconductor layer can be formed of the film having the highest quality by configuring the nitride semiconductor layer with GaN and AlGaN, it is possible to decrease the on-resistance.

In addition, the semiconductor layer may not be necessarily formed of GaN and AlGaN, and may be formed, for example, of an InAlN layer or a mixture of the InAlN.

In addition, in the nitride semiconductor device 1, it is notable that the film thickness of the carrier running layer 30 is 100 nm or less. The holes generated in the carrier running layer 30 by the avalanche breakdown are absorbed by the two-dimensional hole system 30*h* within the same carrier running layer 30. In the nitride semiconductor device 1, since the generation position and the absorption position are within the same layer, it is possible to effectively discharge the holes from the carrier running layer 30. When the film thickness of the carrier running layer 30 exceeds 100 nm and the generation position and the absorption position are separated, the effect of discharging the holes is decreased. Therefore, it is notable that the film thickness of the carrier running layer 30 be 100 nm or less.

In addition, the first barrier layer 20 acts to hold up the entire band structure as shown in FIG. 3 by virtue of the polarization. In the nitride semiconductor device 1, an effect of increasing a threshold voltage is obtained by removing the second barrier layer 40 corresponding to a portion of the gate electrode 80 and forming the gate insulating film 60 and the gate electrode 80 in the removed portion. Since the effect of increasing the threshold voltage is also decreased when the carrier running layer 30 exceeds 100 nm, it is notable that the film thickness of the carrier running layer 30 be 100 nm or less.

In this manner, in the nitride semiconductor device 1, by causing the carrier running layer 30 to be 100 nm or less, the nitride semiconductor device of which the threshold voltage is enhanced and the avalanche capability is high is realized. In addition, by enhancing the threshold voltage, the nitride semiconductor device that is a normally-off-type and has a high avalanche capability is realized.

In addition, in the nitride semiconductor device 1, an acceptor such as Mg or C can be introduced to the first barrier layer 20, and the first barrier layer 20 can be made to be a p-type. In this case, it is possible to increase a hole concentration of the two-dimensional hole system 30*h*. As a result, it is possible to further increase the avalanche capability.

However, it is difficult to activate Mg or C, and it may be concerned that the acceptor or the like may be diffused into the carrier running layer 30. Accordingly, since the first barrier layer 20 is a non-doped layer and the two-dimensional hole system 30*h* has a high mobility in the first embodiment, the avalanche capability is made to be high by causing a bottom portion of the source electrode 120 to be in contact with the non-doped first barrier layer 20.

In addition, as shown in FIG. 2, a depth L2 from the surface of the second barrier layer 40, in the region of which the second barrier layer 40 and the carrier running layer 30 are removed to expose the first barrier layer 20, to the surface of the first barrier layer 20 is shorter than a thickness L1 of the source electrode.

In other words, the length equal to the sum of the film thickness of the first source electrode 100 and the film thickness of the second source electrode 110 is L1, and the length L1 is longer than the depth L2 of which the second barrier layer 40, the carrier running layer 30, and the part of the surface of the first barrier layer 20 are removed.

In addition, the thickness of the source electrode 120 of the region on the second barrier layer 40, that is, a length equal to the sum of the film thickness of the first source electrode 100 and the film thickness of the second source electrode 110 is longer than the length L2. Therefore, the disconnection of the source electrode can be suppressed even if the thickness L1 of the source electrode 120 in the region on the first barrier layer 20 is made to be equal to the thickness of the source electrode 120 in the region on the second barrier layer 40, and the nitride semiconductor device having a high avalanche capability can be readily fabricated by a simple method.

In this manner, even when the step occurs in the source electrode 120, it is difficult to cause the so-called disconnection in the stepped portion. As a result, the source electrode 120 can be in ohmic contact with the two-dimensional electron system 30*e* and the two-dimensional hole system 30*h* at the same time, and the nitride semiconductor device having a high avalanche capability can be readily fabricated.

For example, the film thickness of the carrier running layer 30 is 50 nm, the film thickness of the second barrier layer 40 is 30 nm, L2 is 100 nm, and L1 of the source electrode 120 is 200 nm.

In addition, the length (width) W1 in the boundary in which a part of the source electrode 120 and the first barrier layer 20 are in contact with each other in a direction from the source electrode 120 toward the drain electrode 70 is longer than L2. By causing the depth L2 to be smaller than the width W1 in which the bottom portion 100*b* of the first source electrode 100 is in contact with the first barrier layer 20, it is possible to readily bury the first source electrode 100. The first source electrode can be in ohmic contact with the two-dimensional electron system 12 and the two-dimensional hole system 13 at the same time, and the nitride semiconductor device having a high avalanche capability can be readily fabricated.

For example, the film thickness of the carrier running layer 30 is 50 nm, the film thickness of the second barrier layer 40 is 30 nm, L2 is 100 nm, and the width W1 of the bottom portion 100b of the first source electrode 100 is 2 μm.

(Second Embodiment)

Figure 4:
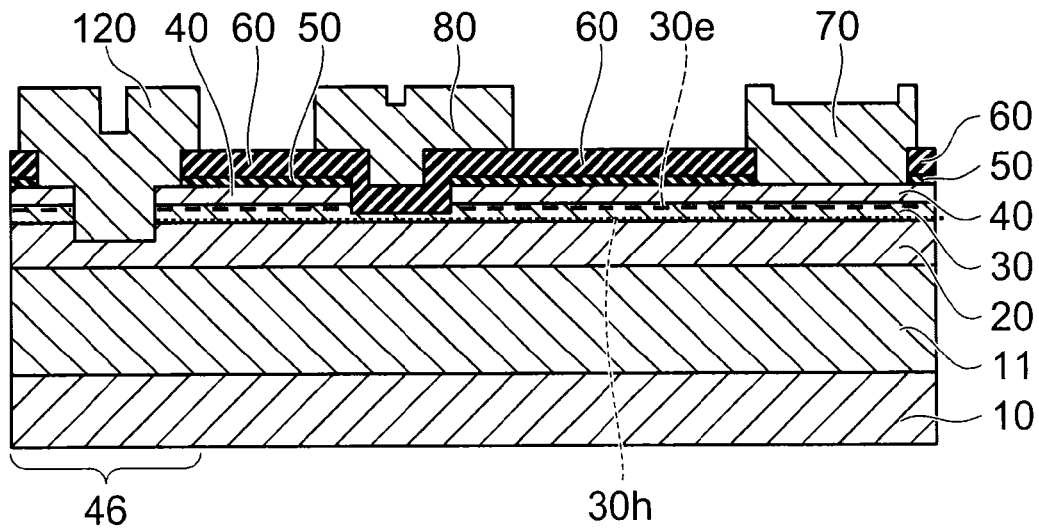
FIG. 4 is a schematic cross-sectional view illustrating a nitride semiconductor device according to a second embodiment.

FIG. 4 is a schematic cross-sectional view illustrating a nitride semiconductor device according to a second embodiment.

A nitride semiconductor device 2 according to the second embodiment differs from the nitride semiconductor device 1 according to the first embodiment in that a source electrode 120 is formed of one kind of material. In other words, the kind of material of a first source electrode 100 and a kind of material of the second source electrode 110 are the same as each other. By causing the kind of material of the source electrode 120 to be one kind, it is possible to more readily fabricate the source electrode 120.

(Third Embodiment)

Figure 5:
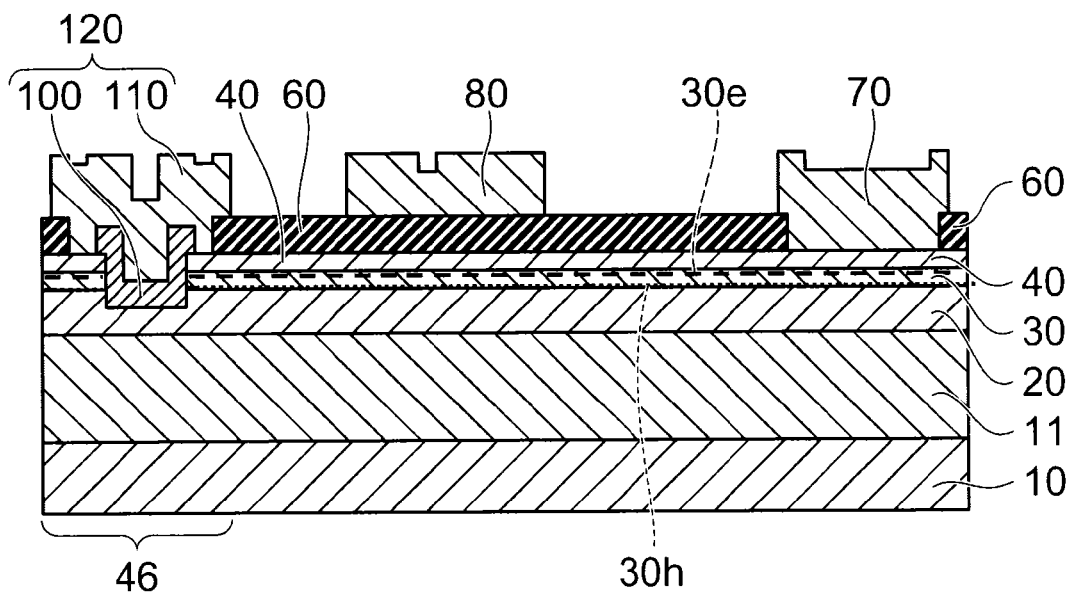
FIG. 5 is a schematic cross-sectional view illustrating a nitride semiconductor device according to a third embodiment.

FIG. 5 is a schematic cross-sectional view illustrating a nitride semiconductor device according to a third embodiment.

A nitride semiconductor device 3 according to the third embodiment differs from the nitride semiconductor device 1 according to the first embodiment in that a second barrier layer 20 and a carrier running layer 30 are not removed in the gate portion.

In this manner, the gate structure is not particularly limited in the embodiment. For example, the gate structure may be a recessed structure or may not be a recessed structure. In addition, the gate structure may be an MIS structure having a gate insulating film 60, a schottky gate structure schottky-connected with a semiconductor layer, or the gate structure may be a junction gate having a p-type layer and an n-type layer. In addition, a surface protection film 50 may be omitted.

The "nitride semiconductor" in the specification includes semiconductors having all compositions in which each of the composition ratios x, y, and z within the range in the chemical formula of $B_xIn_yAl_zGa_{1-x-y-z}N$ ($0 \le x \le 1$, $0 \le y \le 1$, $0 \le z \le 1$, $x+y+z \le 1$) is changed. In addition, in the above chemical formula, the composition further including group V elements other than N (nitrogen), the composition further including various elements added to control various physical properties such as a conductivity type, and the composition further including various elements that are included unintentionally are also included in the "nitride semiconductor."

The embodiments have been described above with reference to examples. However, the embodiments are not limited to these examples. More specifically, these examples can be suitably modified in design by those skilled in the art. Such modifications are also encompassed within the scope of the embodiments as long as they include the features of the embodiments. The components included in the above examples and their layout, material, condition, shape, size and the like are not limited to those illustrated, but can be suitably modified.

Furthermore, the components included in the above embodiments can be combined as long as technically feasible. Such combinations are also encompassed within the scope of the embodiments as long as they include the features of the embodiments. In addition, those skilled in the art can conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor device comprising:
   a substrate;
   semiconductor stacked layers disposed on the substrate, comprising a nitride semiconductor;
   a source electrode and a drain electrode disposed on the semiconductor stacked layers and in contact with the semiconductor stacked layers; and
   a gate electrode disposed on the semiconductor stacked layers and between the source electrode and the drain electrode,
   wherein:
   the semiconductor stacked layers comprise a first barrier layer, a second barrier layer, and a carrier running layer interposed between the first barrier layer and the second barrier layer;
   the second barrier layer and the carrier running layer are absent in a region in which the source electrode on the semiconductor stacked layers is disposed;
   the source electrode comprises a first source electrode and a second source electrode, wherein the first source electrode has a different composition from the second source electrode; and
   the first source electrode is in contact with the first barrier layer, and the second source electrode is in contact with the second barrier layer.

2. The device according to claim 1, wherein the source electrode is in ohmic contact with a two-dimensional hole system formed near an interface between the carrier running layer and the first barrier layer within the carrier running layer in a portion in contact with the first barrier layer.

3. The device according to claim 1, wherein the source electrode is in ohmic contact with a two-dimensional electron system formed near an interface between the carrier running layer and the first barrier layer within the carrier running layer in a portion in contact with the second barrier layer.

4. The device according to claim 1, wherein the first source electrode is in ohmic contact with a two-dimensional hole system formed near an interface between the carrier running layer and the first barrier layer within the carrier running layer.

5. The device according to claim 1, wherein the second source electrode is in ohmic contact with a two-dimensional electron system formed near an interface between the carrier running layer and the second barrier layer within the carrier running layer.

6. The device according to claim 1, wherein the first source electrode comprises at least one element selected from the group consisting of Ni, Pt, and Pd.

7. The device according to claim 1, wherein the second source electrode comprises at least one element selected from the group consisting of Ti and Al.

8. The device according to claim 1, wherein
the carrier running layer comprises GaN,
the first barrier layer comprises $Al_xGa_{1-x}N$ where $0 < X < 1$, and
the second barrier layer comprises $Al_yGa_{1-y}N$ where $0 < Y < 1$, and $Y > X$.

9. The device according to claim 8, wherein X is 0.1 or less.

10. The device according to claim 8, wherein Y is 0.2 or more.

11. The device according to claim 1, wherein the first barrier layer comprises at least one acceptor selected from the group consisting of Mg and C.

12. The device according to claim 1, wherein a film thickness of the carrier running layer is 100 nm or less.

13. The device according to claim 1, wherein a film thickness of the first barrier layer is 20 nm to 2 μm.

14. The device according to claim 1, wherein the first barrier layer is a non-doped layer and a bottom portion of the source electrode is in contact with the first barrier layer.

15. The device according to claim 1, wherein a depth from a surface of the second barrier layer to a surface of the first barrier layer in a region in which the second barrier layer and the carrier running layer are removed to expose the surface of the first barrier layer is shorter than a thickness of the source electrode.

16. The device according to claim 1, wherein a length in a direction toward the drain electrode from the source electrode in a boundary in which a part of the source electrode and the first barrier layer are in contact with each other is longer than a depth from a surface of the second barrier layer to a surface of the first barrier layer in a region in which the second barrier layer and the carrier running layer are removed to expose the surface of the first barrier layer.

17. The device according to claim 1, wherein a thickness of the source electrode disposed on the second barrier layer is greater than a depth from a surface of the second barrier layer to a surface of the first barrier layer in a region in which the second barrier layer and the carrier running layer are removed to expose the surface of the first barrier layer.

* * * * *